United States Patent
Yu et al.

(10) Patent No.: US 9,093,447 B2
(45) Date of Patent: Jul. 28, 2015

(54) CHIP ON WAFER BONDER

(71) Applicant: Taiwan Semiconductor Manufacturing Company, Ltd., Hsin-Chu (TW)

(72) Inventors: Chen-Hua Yu, Hsin-Chu (TW); Jui-Pin Hung, Hsinchu (TW); Weng-Jin Wu, Hsinchu (TW); Jean Wang, Hsin-Chu (TW); Wen-Chih Chiou, Miaoli (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/767,554

(22) Filed: Feb. 14, 2013

(65) Prior Publication Data

US 2013/0157412 A1    Jun. 20, 2013

Related U.S. Application Data

(62) Division of application No. 12/054,097, filed on Mar. 24, 2008, now Pat. No. 8,387,674.

(60) Provisional application No. 60/991,401, filed on Nov. 30, 2007.

(51) Int. Cl.
   *B29C 65/00*      (2006.01)
   *H01L 25/00*      (2006.01)
   (Continued)

(52) U.S. Cl.
   CPC .......... *H01L 25/50* (2013.01); *H01L 21/67051* (2013.01); *H01L 24/75* (2013.01); *H01L 24/83* (2013.01); *H01L 24/94* (2013.01); *H01L 24/28* (2013.01); *H01L 2224/8301* (2013.01); *H01L 2224/8385* (2013.01); *H01L 2224/83192* (2013.01); *H01L 2924/0105* (2013.01);
   (Continued)

(58) Field of Classification Search
   CPC ... H01L 21/67051; H01L 24/75; H01L 24/83; H01L 24/94; H01L 25/50; H01L 2224/8301; H01L 2224/83191; H01L 2224/8385; H01L 2924/01029; H01L 2924/01094; H01L 2924/07802; H01L 2924/14; H01L 2924/19042; H01L 2924/01005; H01L 2924/01006; H01L 2924/01033; H01L 2924/0105; H01L 2924/1461; H01L 24/28; H01L 2924/00; Y10T 156/14
   USPC ................... 156/285, 281; 257/782; 438/906; 430/322
   See application file for complete search history.

(56) References Cited

U.S. PATENT DOCUMENTS 3,667,830 A   6/1972   Rottmiller
3,681,103 A   8/1972   Brown
(Continued)

FOREIGN PATENT DOCUMENTS

CN   1299518        6/2001
WO   WO2006030895 A1   3/2006

OTHER PUBLICATIONS

Chinese Patent Office, Office Action dated Feb. 26, 2010, Application No. 200810169259.3, 14 pages.

*Primary Examiner* — Jacob T Minskey
*Assistant Examiner* — Vishal I Patel
(74) *Attorney, Agent, or Firm* — Haynes and Boone, LLP (57) ABSTRACT

The present disclosure provides a bonding apparatus. The bonding apparatus includes a cleaning module designed for cleaning chips; and a chip-to-wafer bonding chamber configured to receive the chips from the cleaning module and designed for bonding the chips to a wafer.

3 Claims, 5 Drawing Sheets (51) Int. Cl.
*H01L 21/67* (2006.01)
*H01L 23/00* (2006.01)

(52) U.S. Cl.
CPC ............... *H01L2924/01005* (2013.01); *H01L 2924/01006* (2013.01); *H01L 2924/01029* (2013.01); *H01L 2924/01033* (2013.01); *H01L 2924/01094* (2013.01); *H01L 2924/07802* (2013.01); *H01L 2924/14* (2013.01); *H01L 2924/1461* (2013.01); *H01L 2924/19042* (2013.01); *Y10T 156/14* (2015.01)

(56) References Cited

U.S. PATENT DOCUMENTS

| | | | |
|---|---|---|---|
| 3,971,860 | A | 7/1976 | Broers et al. |
| 4,264,711 | A | 4/1981 | Greeneich |
| 4,463,265 | A | 7/1984 | Owen et al. |
| 4,498,010 | A | 2/1985 | Biechler et al. |
| 4,621,371 | A | 11/1986 | Gotou et al. |
| 4,712,013 | A | 12/1987 | Nishimura et al. |
| 4,743,766 | A | 5/1988 | Nkasuji et al. |
| 4,746,587 | A | 5/1988 | Nicholas |
| 4,761,560 | A | 8/1988 | Glendinning |
| 4,812,962 | A | 3/1989 | Witt |
| 4,816,361 | A | 3/1989 | Glendinning |
| 4,998,020 | A | 3/1991 | Misaka et al. |
| 5,008,553 | A | 4/1991 | Abe |
| 5,057,462 | A | 10/1991 | Eisenberg et al. |
| 5,082,762 | A | 1/1992 | Takahashi |
| 5,090,609 | A * | 2/1992 | Nakao et al. ............... 228/123.1 |
| 5,097,138 | A | 3/1992 | Wakabayashi et al. |
| 5,130,213 | A | 7/1992 | Berger et al. |
| 5,177,367 | A | 1/1993 | Suzuki |
| 5,229,320 | A | 7/1993 | Ugajin |
| 5,241,185 | A | 8/1993 | Meiri et al. |
| 5,254,438 | A | 10/1993 | Owen et al. |
| 5,336,892 | A | 8/1994 | Dobisz et al. |
| 5,441,849 | A | 8/1995 | Shiraishi et al. |
| 5,518,572 | A | 5/1996 | Kinoshita et al. |
| 5,532,496 | A | 7/1996 | Gaston |
| 5,701,014 | A | 12/1997 | Berger et al. |
| 5,792,581 | A | 8/1998 | Ohnuma |
| 5,798,196 | A | 8/1998 | Okino |
| 5,808,310 | A | 9/1998 | Yamashita et al. |
| 5,825,040 | A | 10/1998 | Marrian et al. |
| 5,847,959 | A | 12/1998 | Veneklasen et al. |
| 5,888,682 | A | 3/1999 | Nakasuji |
| 5,986,765 | A | 11/1999 | Nakasuji |
| 5,994,009 | A | 11/1999 | Tzu et al. |
| 6,017,658 | A | 1/2000 | Rhee et al. |
| 6,087,048 | A | 7/2000 | Suzuki et al. |
| 6,110,395 | A | 8/2000 | Gibson, Jr. |
| 6,126,323 | A | 10/2000 | Tange |
| 6,143,129 | A | 11/2000 | Savas et al. |
| 6,361,911 | B1 | 3/2002 | Tsai et al. |
| 6,373,071 | B1 | 4/2002 | Innes et al. |
| 6,501,083 | B1 | 12/2002 | Kamiji |
| 6,528,934 | B1 | 3/2003 | Chen et al. |
| 6,531,069 | B1 | 3/2003 | Srivastava et al. |
| 6,551,447 | B1 | 4/2003 | Savas et al. |
| 6,590,344 | B2 | 7/2003 | Tao et al. |
| 6,596,444 | B2 | 7/2003 | Buck |
| 6,642,530 | B2 | 11/2003 | De La Rosa |
| 6,673,199 | B1 | 1/2004 | Yamartino et al. |
| 6,777,037 | B2 | 8/2004 | Sumiya et al. |
| 6,805,138 | B2 | 10/2004 | Akbar et al. |
| 6,821,910 | B2 | 11/2004 | Adomaitis et al. |
| 6,828,573 | B1 | 12/2004 | Kawano et al. |
| 6,872,507 | B2 | 3/2005 | Tzu et al. |
| 7,311,784 | B2 | 12/2007 | Fink |
| 7,488,688 | B2 | 2/2009 | Chung et al. |
| 7,602,070 | B2 | 10/2009 | Tong et al. |
| 7,883,601 | B2 | 2/2011 | Chang |
| 2002/0005252 | A1 | 1/2002 | Masuda et al. |
| 2002/0130164 | A1 * | 9/2002 | Matsuki et al. ............... 228/206 |
| 2003/0155079 | A1 | 8/2003 | Bailey, III et al. |
| 2004/0103844 | A1 | 6/2004 | Chou et al. |
| 2005/0087893 | A1 * | 4/2005 | Chung et al. .......... 257/E21.311 |
| 2005/0161795 | A1 * | 7/2005 | Tong et al. .................... 257/686 |
| 2006/0102286 | A1 | 5/2006 | Kim |
| 2006/0289297 | A1 * | 12/2006 | Miyoshi ................... 204/196.01 |
| 2007/0051462 | A1 | 3/2007 | Nakayama et al. |
| 2007/0087505 | A1 | 4/2007 | Thakur |
| 2007/0286967 | A1 | 12/2007 | Ide et al. |
| 2009/0142903 | A1 | 6/2009 | Yu et al. |

* cited by examiner

CHIP ON WAFER BONDER

PRIORITY DATA

The present application is a divisional application of U.S. patent application Ser. No. 12/054,097, filed Mar. 24, 2008, which claims priority to U.S. provisional application No. 60/991,401, filed Nov. 30, 2007, each of which is hereby incorporated by reference in its entirety.

BACKGROUND

In semiconductor technologies, multiple chips can be bonded to a semiconductor wafer, referred to as chip-to-wafer bonding, to achieve three dimensional packing with high packing density, short wiring, and improved reliability and quality. The chip-to-wafer bonding technology has various applications including imaging sensors, memory devices, micro-electro-mechanical systems, to name a few. When semiconductor technologies increase integrated circuit (IC) pattern density and shrink feature size of the IC pattern, there are high requirements on bonding environment and bonding efficiency. However, the current chip-to-wafer bonding tools experience issues including oxygen contamination associated with contact degradation and low throughput associated with high fabrication cost which hinder the process.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

DETAILED DESCRIPTION

The present disclosure relates generally to bonding systems and a method of utilizing such systems for wafer bonding. It is understood, however, that the following disclosure provides many different embodiments, or examples, for implementing different features of the invention. Specific examples of components and arrangements are described below to simplify the present disclosure. These are, of course, merely examples and are not intended to be limiting.

Figure 1:
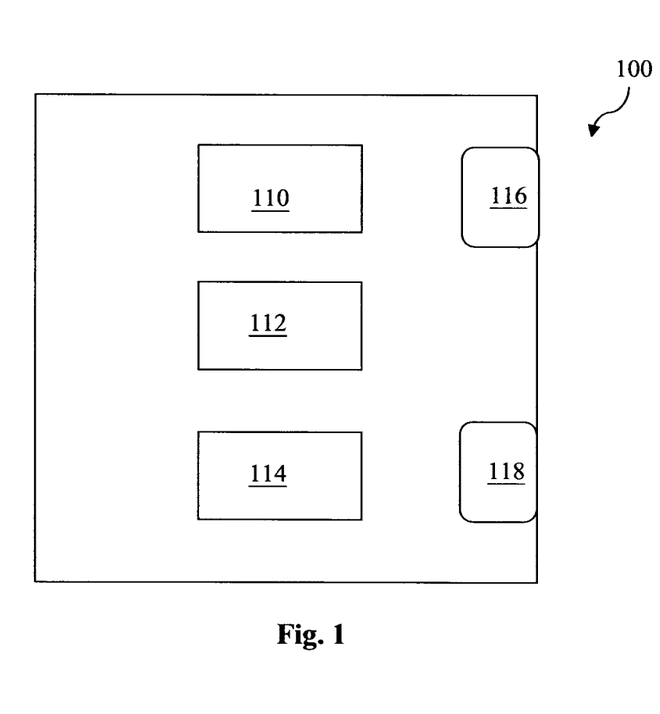
FIG. 1 is a block diagram of an embodiment of a chip-to-wafer bonding system integrated with a cleaning module and a wafer level bonding module constructed according to aspects of the present disclosure.

Referring to FIG. 1, illustrated is a block diagram of an embodiment of a chip-to-wafer bonding system (or apparatus) 100 constructed according to aspects of the present disclosure. The chip-to-wafer bonding system 100 is configured and designed to achieve an oxygen-free environment, high bonding throughput, and/or other advantages in chip-to-wafer bonding processes.

The chip-to-wafer bonding system 100 includes an embedded cleaning module 110 designed to clean chips to be bonded to a wafer. The cleaning module 110 can be designed for dry cleaning and/or wet cleaning. In one embodiment, the cleaning module 110 is designed to remove oxide formed on the contacts features of the chips to be bonded. The contact features are usually are metal, such as Cu, and can be easily turned to oxide when exposed to oxygen environment. The cleaning module 110 may be designed to further remove particles and other contaminants. In one example, the cleaning module 110 is designed to implement wet cleaning, utilizing chemical and de-ionized water (DIW). In another example, the cleaning module 110 is designed to implement dry cleaning utilizing chemical gas(es) and remote plasma. The cleaning module 110 may be configured to implement a chamber type clean mechanism or tunnel type cleaning mechanism. In one embodiment, the cleaning module 110 includes a chamber operable to perform a cleaning process to one chip or multiple chips simultaneously. The chamber type cleaning module may use plasma, formic acid vapor, and/or reduction gas such as hydrogen. In another embodiment, the cleaning module 110 include a tunnel operable to transport and clean one chip or multiple chips therethrough, from a chip loading region to a chip buffer region or chip-to-wafer bonding module described below. In the tunnel type cleaning module, a conveyor may be utilized and further integrated with various gas injectors. For example, the gas injectors include cleaning gas injectors and protective gas injectors. The cleaning gas injectors are configured to inject cleaning gas(es) such as (HCOOH). The protective gas injectors are configured to inject protective gas such as nitrogen and/or other suitable inert gas.

The bonding system 100 includes a chip-to-wafer bonding module 112 operable to bond one chip or multiple chips to a wafer. The chip-to-wafer bonding module 112 includes a chamber configured to implement chip to wafer bonding. The chip-to-wafer bonding module 112 is positioned approximate the cleaning module 110 such that the chips can be transferred efficiently. The chip-to-wafer bonding module 112 includes a wafer stage to hold a wafer to be bonded with multiple chips. The wafer is oriented and aligned before the bonding chip-to-wafer bonding process. The chip-to-wafer bonding module 112 includes a bonding arm (or bond arm) to pick up, hold, align and bond a chip to the wafer positioned on the wafer stage. The chip-to-wafer bonding module 112 also includes an alignment mechanism capable of aligning a to-be-bonded chip to the wafer such that the chip can be properly bonded to an intended location of the wafer. The alignment process may include a course alignment and a fine alignment. The alignment mechanism is integrated with the bonding arm in one example. Chips are bonded to the wafer in various embodiments. For example, chips are bonded in dicing frame with adhesive tape. The chip-to-wafer bonding module 112 may include a gas supply mechanism to provide a protective gas to the chip-to-wafer bonding chamber to protect the chips and wafer therein. For example, the protective gas, such as nitrogen gas or other suitable inert gas, is provided, maintaining a low oxygen concentration environment. In other examples, the chip-to-wafer bonding module 112 may be configured to provide other gas(es), such as forming gas, and/or formic acid vapor for cleaning and removing contamination. Furthermore, the chip-to-wafer bonding module includes an enclosed space (small chamber) having the chips and wafer inside with a low oxygen concentration environment and/or cleaning gas environment. The bonding arm is at least partially included in the smaller chamber. The alignment structure may be configured outside of the smaller chamber. The smaller chamber may include a small transparent window configured for proper bonding and alignment. With the small chamber, the gas supply can be more efficiently and cost-effectively. In another embodiment, the chip-to-wafer module 112 may be maintained in a vacuum state. A chip-to-wafer bonding chamber (or small chamber) is operable to be pumped to and maintained at a vacuum state to achieve an reduced oxygen concentration. For example, the oxygen concentration is maintained at below about 30 ppb. The chip-to-wafer bonding module 112 may also include a heat unit configured to heat the wafer for proper bonding. For example, the heat unit may maintain the wafer or control the bonding chip-to-wafer bonding chamber at a temperature ranging between about 23 C and about 500 C. The bonding arm may also be designed to heat the to-be-bonded chip and maintain it at a temperature ranging between about 23 C and about 500 C. In another embodiment, both the bonding arm and the heater are operable to maintain the chip and wafer at a temperature up to about 500 C.

The chip-to-wafer bonding system 100 may additionally include an embedded wafer level bonding module 114 integral to the chip-to-wafer bonding module 112 in order to implement a wafer level bonding process in the same system for efficiency, reduce contamination and oxidation, and other processing advantages. The wafer level bonding module 114 may be configured proximate to the chip-to-wafer bonding module 112 for efficient wafer transportation. In one example, the wafer level bonding process includes applying an adhesive material to the chips and wafer bonded together in the chip-to-wafer bonding module 112. The adhesive material may fill spaces among the wafer and the chips such as gaps around bonded contacts. In another example, the wafer level bonding process applies a high temperature and high pressure to the bonded chips and wafer to enhance the bonding strength. In one example, the wafer level bonding module 114 is configured with heating unit operable to maintain the bonded chips and wafer at a temperature ranging between about 100 C and about 500 C. A bonding force applied to the wafer may range up to about 8000 kg, depending on chip type, structure and other relevant factors. Since the high temperature bonding is implemented once for all chips in the wafer level bonding module 114, the thermal budge is well limited and controlled. In one embodiment, the wafer level bonding module 114 includes a wafer level bonding chamber to perform the wafer level bonding process. The wafer level bonding chamber is protected from oxide contamination and/or is operable to remove oxide. For example, the wafer level bonding module may be protected by an inert gas, such as nitrogen. In another embodiment, the wafer level bonding module is also supplied with the forming gas to remove the oxide. In another example, the wafer level bonding module is maintained in a vacuum state, the oxygen is therefore reduced accordingly.

In another embodiment, the wafer level bonding module 114 includes a pre-clean chamber for cleaning a wafer. The wafer level bonding module 114 may further include a buffer chamber configured to receive a wafer from a wafer loading region and transfer the wafer among the pre-clean chamber, the chip-to-wafer bonding module and the wafer level bonding chamber. In another embodiment, the pre-clean chamber and the wafer level bonding chamber are combined into a single chamber for efficiency.

The chip-to-wafer bonding system 100 may further include one or more loading structure to load chips and wafers to the bonding system 100. In one embodiment, the chip-to-wafer bonding system 100 includes a chip loading structure 116 for loading chips to the bonding system 100, followed by chip cleaning and chip-to-wafer bonding. In one example, the chip loading structure 116 is configured approximate the cleaning module 110. The chip loading structure 116 loads chips and transfer thereof to the cleaning module 110 to perform a cleaning process. In another embodiment, the bonding system 100 includes a wafer loading structure 118 to load a wafer to the bonding system 100. For example, the wafer loading structure 118 is configured approximate the wafer buffer chamber in the wafer level bonding module 114 such that a wafer can be loaded to the wafer buffer chamber. Then the wafer is transported to the pre-clean chamber for wafer cleaning, followed by the chip-to-wafer bonding and the wafer level bonding.

Figure 2:
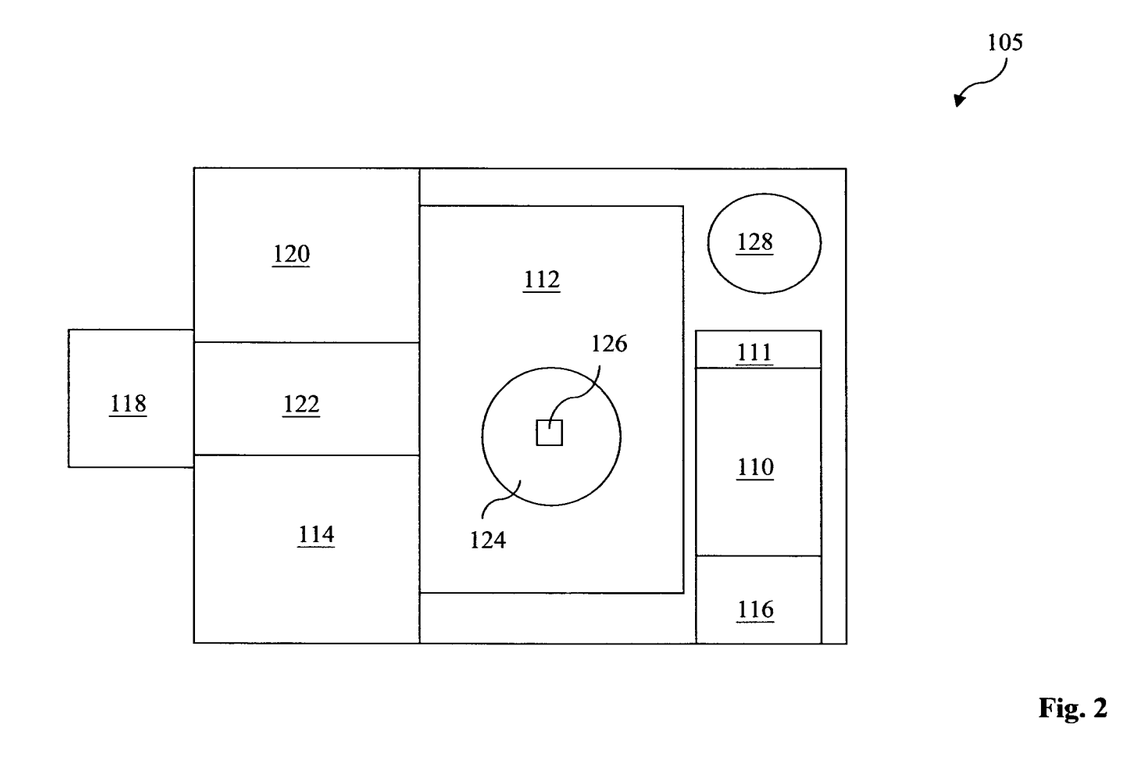
FIG. 2 is a block diagram of another embodiment of a chip-to-wafer bonding system with an embedded cleaning module constructed according to aspects of the present disclosure.

FIG. 2 illustrates a block diagram of another embodiment of a chip-to-wafer bonding system (or apparatus) 105 with an embedded cleaning module constructed according to aspects of the present disclosure. The chip-to-wafer bonding system 105 includes an embedded cleaning module 110 designed for cleaning chips. The cleaning module 110 may be designed for dry cleaning and/or wet cleaning. The cleaning module 110 is designed to remove oxide contamination. The cleaning module 110 may be designed to further remove particles and other contaminants. In one embodiment, the cleaning module 110 is designed to implement wet cleaning, using liquid such as chemical and de-ionized water (DIW). In another embodiment, the cleaning module 110 is designed to implement dry cleaning using chemical gases and/or mechanical cleaning. The cleaning module 110 is configured to implement chamber type cleaning and/or tunnel type cleaning. In one embodiment, the cleaning module 110 includes a chamber for performing a cleaning process to one or more chips simultaneously or sequentially. The chamber type cleaning module may use plasma, formic acid vapor, and/or reduction gas. In another embodiment, the cleaning module 110 includes a tunnel structure operable for transporting and cleaning one or more chips simultaneously.

Figure 3A:
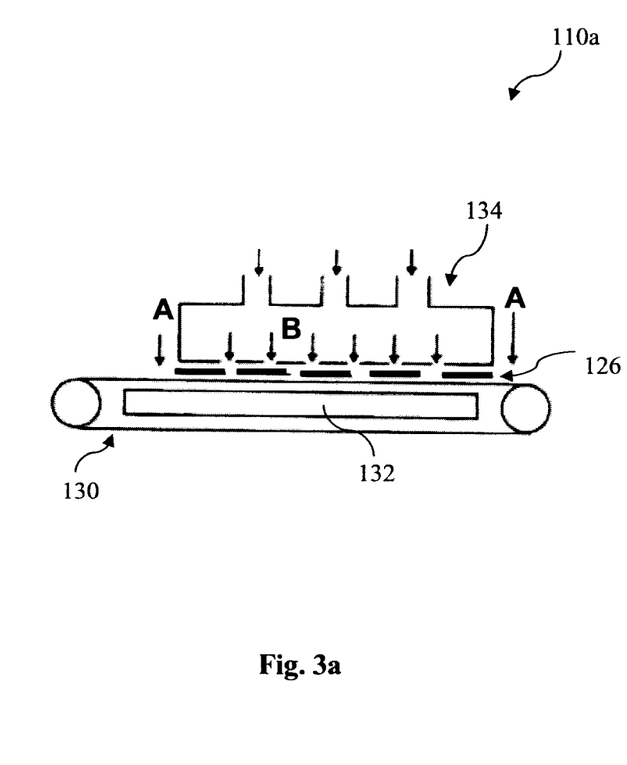
FIGS. 3a and 3b illustrate schematic views of an embedded cleaning module, in various embodiments, which may be configured in the system of FIG. 1 or the system of FIG. 2 constructed according to aspects of the present disclosure.

As one embodiment, a tunnel type cleaning module 110a is provided and illustrated in FIG. 3a in a schematic view. The embedded tunnel type cleaning module 110a includes a conveyor 130 such as a belt conveyor or a similar mechanism for transporting one chip or multiple chips 126. The tunnel type cleaning module 110a also includes a heating unit 132 configured to control and maintain the temperature of the chips 126 on the conveyor 130. The tunnel type cleaning module 110a also includes a chemical supply structure 134 configured and designed to provide various chemicals to clean the chips. For example, the chemical supply structure 134 provides a cleaning chemical flow, flowing in a direction as labeled as "B" for example, to the chip(s) 126. In furtherance of the example, the chemical flow includes HCOOH chemical to remove oxide. The chemical flow may include other chemical to remove oxide and other contaminations. The chemical supply structure 134 also provides a protective gas flow in a region and a direction, labeled as "A", to protect the chips from oxygen contamination. In one example, the protective gas includes nitrogen and/or other suitable inert gas.

Figure 3B:
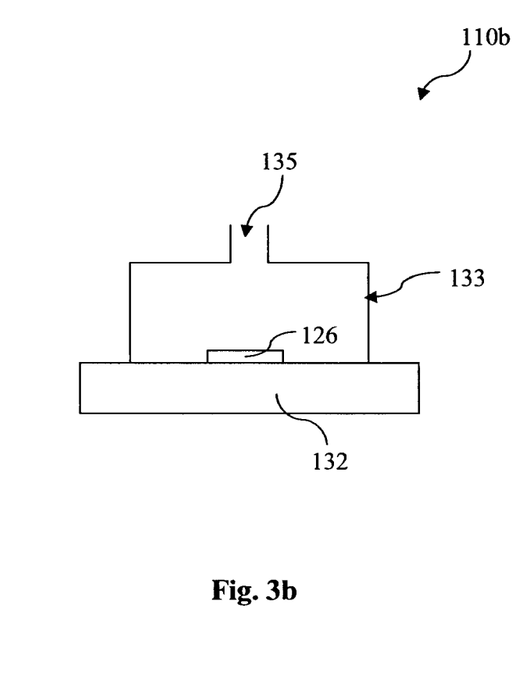

In another embodiment, a chamber type cleaning module 110b is provided and illustrated in FIG. 3b in a schematic view. The embedded tunnel type cleaning module 110b includes a heating unit 132 to heat the chip(s) 126, positioned on a chip stage. The chip stage can be integrated with the heating unit 132. The chamber type cleaning module 110b has a chamber 133 to enclose the heating unit 132 and chips 126 inside. In one example, the chamber type cleaning module 110b also includes a gas supply mechanism 135 configured to provide various chemicals to clean the chips. The chemical may include HCOOH to remove oxide. In another example, the gas supply mechanism 135 provides a reduction gas to the chamber 133. The reduction gas includes remote plasma of forming gas and/or other suitable gas.

Referring again to FIG. 2, the cleaning module 110 may further include a chip buffer stage 111 for chip transportation after the cleaning to a chip-to-wafer bonding module described below. A bonding arm of the chip-to-wafer bonding module can pick up a chip from the chip buffer stage 111 and move the chip to the chip-to-wafer bonding module for the following bonding process.

The chip-to-wafer bonding system 105 may include a chip loading mechanism 116 to load chips to the bonding system for cleaning and bonding. As one example, the chip loading mechanism 116 is configured adjacent the cleaning module 110 such that the loaded chips can be efficiently transferred to the cleaning module 110.

The chip-to-wafer bonding system 100 includes chip-to-wafer bonding module 112 operable to bond one chip or multiple chips 126 to a wafer 124. The wafer 124 is positioned on a wafer stage. The chip-to-wafer bonding module 112 further includes a bonding arm and alignment mechanism to pick, hold, align and bond the chip 126 to the wafer 124. The chip-to-wafer bonding module 112 includes a chamber configured to implement chip to wafer bonding. The chip-to-wafer bonding module 112 may be approximate the cleaning module 110. In one example, the chip-to-wafer bonding module 112 is adjacent the chip buffer stage 111 such that a bonding arm can pick up a chip from the chip buffer stage after cleaning.

An embedded chip-to-wafer bonding module 112a is provided below in details, as one embodiment, with reference to FIG. 4a in a schematic view. The chip-to-wafer bonding module 112a includes a small chamber 136 for chip to wafer processing. The chip-to-wafer bonding module 112a may further include a transparent material layer (or transparent window) 138 incorporated in the chip-to-wafer bonding chamber 136, serving as a transparent window for proper aligning and bonding. The chip-to-wafer bonding module 112a includes a wafer stage 140, configured inside the small chamber 136, to support a wafer 124. The chip-to-wafer bonding module 112a also include a bonding arm 142 configured at least partially inside the small chamber 136. An alignment mechanism may be configured outside of the small chamber and coupled to the bonding arm. Thus configured efficient chamber 136 has a small volume. Various methods can be efficiently and cost-effectively implemented to remove and/or reduce oxygen concentration. For example, the nitrogen and/or HCOOH can be supplied cost-effectively due to the small volume of the chamber 136. The bonding arm and the wafer stage may be heated and maintained in a temperature range from about 23 C to about 500 C.

As another embodiment, an embedded chip-to-wafer bonding module 112b is provided below in details, with reference to FIG. 4b in a schematic view. The chip-to-wafer bonding module 112b includes a chamber 139 relatively large, compared to the chamber 136 of FIG. 4a. The chamber 139 is configured to enclose the bonding arm 142 inside. The chip-to-wafer bonding module 112b also includes a wafer stage 140, configured inside the chip-to-wafer bonding chamber 139, to hold a wafer 124. The chip-to-wafer bonding module 112b also includes an alignment mechanism coupled with the bonding arm for chip alignment.

Figure 4A:
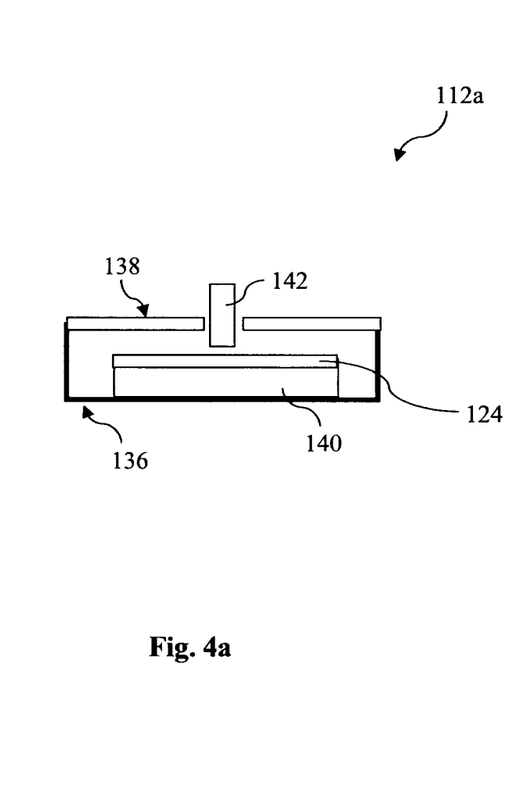
FIGS. 4a and 4b illustrate schematic views of an embedded chip-to-wafer bonding module, in various embodiments, which may be configured in the system of FIG. 1 or the system of FIG. 2 constructed according to aspects of the present disclosure.
Figure 4B:
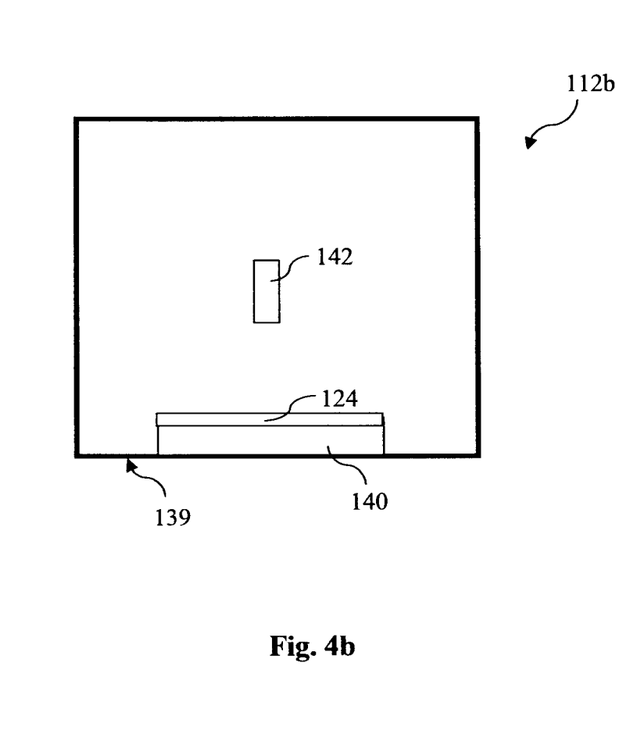

Referring to FIGS. 2, 4a and 4b, an alignment mechanism is coupled to the bonding arm such that the chip 126 can be properly bonded to an intended position of the wafer 124. In various examples, chip(s) may be bonded in dicing frame and/or with adhesive tape. The chip-to-wafer bonding module 112 may include a gas supply mechanism to provide a protective gas to the chip-to-wafer bonding chamber to protect the chips and wafer from oxygen and other contamination. For example, the protective gas includes nitrogen gas, or other suitable inert gas. In one embodiment, the inert gas flow may be about 500 liter/min or higher. The oxygen concentration inside the chip-to-wafer bonding chamber 112a or 112b is reduced to less than about 30 ppb. In another embodiment associated with the chip-to-wafer bonding module 112a, an inert gas flow is maintained in the chamber 136 to create an reduced-oxygen environment. For example, a nitrogen gas flows into the chip-to-wafer bonding chamber and exits the chamber through the space between the bonding arm 142 and the transparent window 138.

In other examples, the chip-to-wafer bonding module 112 may be configured additionally or alternatively to provide other gas(es), such as forming gas like hydrogen, and/or formic acid vapor for cleaning and removing contamination. For example, HCOOH may be provided to the chip-to-wafer bonding chamber to remove oxide and reduce the contact resistance during the chip to wafer bonding process. In another example, the chip-to-wafer bonding chamber 112b may alternatively be maintained at a vacuum state to achieve a reduced-oxygen environment. The chip-to-wafer bonding module 112 may also include a heating unit configured to heat the wafer for proper bonding effect. For example, the heating unit may maintain the wafer at a temperature ranging between about 23 C and about 500 C. The bonding arm may also be heated such that the chip is in a similar temperature.

The chip-to-wafer bonding system 105 may additionally include an embedded wafer level bonding module 114 integral to the chip-to-wafer bonding module 112. Thus, a wafer level bonding process can be implemented in the same system. The wafer level bonding module 114 includes a chamber. The wafer level bonding module 114 is configured approximate the chip-to-wafer bonding module 112. In one embodiment, the wafer level bonding process includes applying an adhesive material to the bonded chips and wafer. For example, the adhesive material is substantially filled in the spaces among the wafer and chips such as gaps between the bonded contacts. In another embodiment, the wafer level bonding process includes applying a high temperature and high pressure to the bonded chips and wafer to enhance the bonding strength. For example, the wafer level bonding module 114 includes a heating unit and a temperature controller to maintain the temperature inside the wafer level bonding chamber in a range between about 100 C and about 500 C. In another example, the wafer level bonding module 114 is operable to apply a bonding force to the bonded wafer and chips to enhance the bonding strength. The bonding force applied can be up to about 8000 kg, depending on the chips and wafer. The bonding force can be applied by an air pressure, for example.

The chip-to-wafer bonding system 105 may also include a wafer cleaning chamber (or wafer pre-clean) 120 for wafer cleaning. The wafer cleaning chamber 120 is located approximate the chip-to-wafer bonding chamber.

The chip-to-wafer bonding system 105 may also include a buffer chamber 122 configured between the wafer level bonding module 114 and wafer cleaning chamber 120 to receive a wafer and transfer the wafer among the wafer cleaning chamber 120, the chip-to-wafer bonding module 112 and the wafer level bonding module 114.

The chip-to-wafer bonding system 100 may further include one or more loading structure to load wafers to the chip-to-wafer bonding system 105. In one embodiment, the chip-to-wafer bonding system 105 includes a wafer loading structure 118 to load a wafer to the bonding system 105 for wafer cleaning and bonding. For example, the wafer loading structure 118 is configured approximate the wafer buffer chamber 122 such that a wafer can be loaded to the wafer buffer chamber 122. Then the wafer is transported from the buffer chamber 122 to the wafer cleaning chamber 120 for wafer cleaning, to the chip-to-wafer boding module 112 for chip-to-wafer bonding and to the wafer level bonding module 114 for wafer level bonding.

The chip-to-wafer bonding system 105 may further include a control module 128 coupled to various cleaning and bonding modules and chambers of the bonding system 105 and operable to control and coordinate those modules and chambers for cleaning and bonding. The control module 128 includes software and hardware. For example, the control module 128 may include a memory device to store and maintain processing parameters, data and recipes. In another example, the control module is coupled to an intranet or the Internet, such that parameters, data and/or recipes can be uploaded or downloaded or shared with other processing tools. The control module 128 may also be distributed into various locations and coupled through the network. In one example, the control module 128 is coupled to a manufacturing execution system (MES) and is compatible with the existing manufacturing control protocol.

Figure 5:
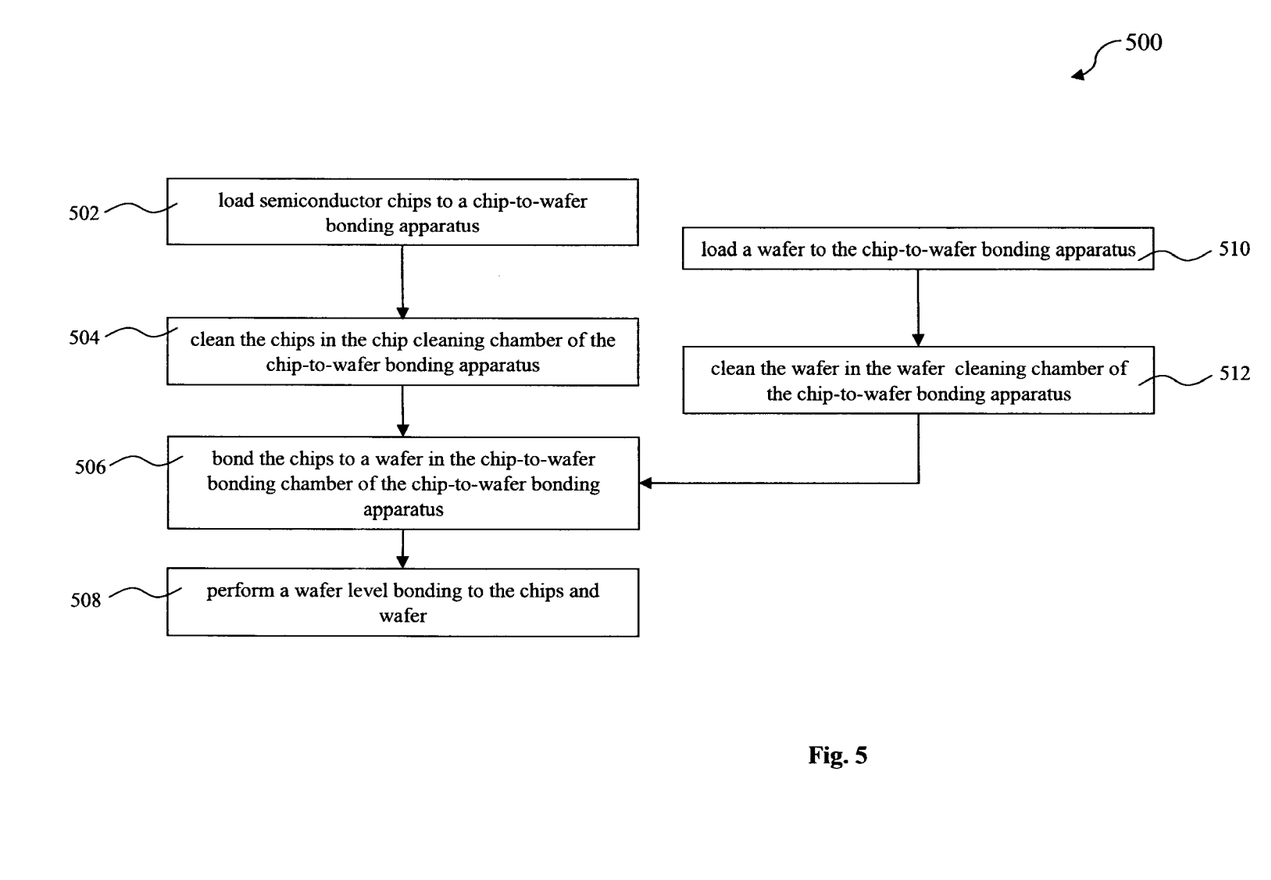
FIG. 5 is a flowchart of one embodiment of a method utilizing the chip-to-wafer bonding system of FIG. 1 or the system of FIG. 2 constructed according to aspects of the present disclosure.

FIG. 5 is a flowchart of one embodiment of a method 500 utilizing the chip-to-wafer bonding system 100 of FIG. 1 or the chip-to-wafer bonding system 105 of FIG. 2 constructed according to aspects of the present disclosure. The method 500 is described below with further reference to FIGS. 1-4. The chip-to-wafer bonding method 500 may begin at step 502 by loading one or more semiconductor chips to the chip-to-wafer bonding system 100 of FIG. 1 or system 105 of FIG. 2. For example, a plurality of chips, diced from a wafer, are loaded to the chip loading structure 116.

The method 500 proceeds to step 504 by performing a cleaning process to the loaded chips in the cleaning module 110. The chip cleaning process implements wet cleaning process and/or dry cleaning to remove the oxide of the chips. The chip cleaning process may use de-ionized water and HCOOH to clean the chips. The chip cleaning process may further use forming gas (hydrogen) to remove the oxide. In another example, the chip cleaning process uses formic acid vapor. The chip cleaning process may be implemented to remove particles or other contaminations from the chips. The cleaned chips may then be sent to the chip buffer stage 111 after the cleaning.

The method 500 proceeds to step 506 by bonding the cleaned chips to a wafer in the chip-to-wafer bonding module 112. In one example, the bonding arm 142 picks up a chip from the chip buffer stage 111 or the cleaning chamber 110, moves the chip to the chip-to-wafer bonding chamber 112, aligns the chip to the wafer positioned on the wafer stage 140, place the chip to the wafer, and bonds the chip to the wafer thermally and/or mechanically. The chip-to-wafer bonding chamber may be maintained in an oxygen-free environment to reduce any oxidation degradation. For example, nitrogen is provided to the chip-to-wafer bonding chamber to protect the wafer and the chip from oxidation. The particle contamination is reduced or eliminated as well by utilizing a chip-to-wafer bonding chamber. The bonding process is performed in a temperature ranging from about 23 C to about 500 C. If a plurality of chips are to be bonded to the wafer. The above procedure can be repeated to each chip until the all to-be-bonded chips are bonded on the wafer.

The method 500 proceeds to step 508 by performing a wafer level bonding process to the bonded wafer and chips in the wafer level bonding module 114. After all to-be-bonded chips have been bonded to the wafer at step 506, the wafer with bonded chips is sent to the wafer level bonding module 114 to implement a wafer level bonding process. For example, the wafer with bonded chips is sent to the wafer buffer chamber 122 and then transferred to the wafer level bonding module 114. The wafer level bonding module 114 may be heated to a temperature ranging between about 100 C and 500 C during the wafer level bonding process. The wafer level bonding process may include applying an adhesive material to the bonded wafer and chips, filling the spaces among the bonded wafer and chips such as gaps around the bonded contacts. The wafer level bonding process may include applying a high temperature and high pressure to the bonded wafer and chips to enhance the bonding strength and bonding quality. The wafer level bonding temperature may range between about 100 C and 500 C. The wafer level bonding force may be up to about 8000 kg depending on chip type. Bonding force may be applied through an air pressure or other suitable method. During the wafer level bonding, the wafer level bonding module 114 is protected from oxygen contamination and/or is designed to remove oxide. In various embodiments, the wafer level bonding module 114 may implement nitrogen, other inert gas, forming gas and/or HCOOH vapor to protect the wafer level bonding. In another embodiment, the wafer level bonding module is maintained at a vacuum environment. The bonded wafer and chips are thereafter sent out of the chip-to-wafer bonding system for further processing, testing and packing.

The method 500 may also include a wafer processing procedure for wafer loading and cleaning, including steps 510 and 512, then the cleaned wafer is used for chip-to-wafer bonding at steps 506 and 508 as illustrated in the flowchart of FIG. 5. At step 510, a wafer is loaded to the chip-to-wafer bonding system 100 or 105. For example, the wafer is loaded through the wafer loading structure 118 to the buffer chamber 122.

The wafer processing procedure proceeds to step 512 by performing a cleaning process to the wafer in the wafer cleaning chamber 120. In one example, the wafer is transported from the buffer chamber 122 to the wafer cleaning chamber 120 and is cleaned. The wafer cleaning process may implement cleaning process and/or chemicals to remove oxide from the wafer, similar to those for chip cleaning. Particles and other contaminations may also be removed. In one example, cleaning chemicals and de-ionized water (DIW) are used to remove the oxide form the wafer. In another example, a dry cleaning process may be implemented using chemical gases and/or mechanical cleaning. Thereafter, the cleaned wafer is sent to the chip-to-wafer bonding module 112 for a pre-alignment and then chip-to-wafer bonding as described at step 506.

The above described system and method only serve as examples. The above system and method may be extended and modified and may include proper variations, embodiments, and alternatives without departure of the spirit of the invention. For example, the wafer used in the chip-to-wafer bonding may be a semiconductor wafer or other substrates to be patterned such as a glass substrate for thin film transistor liquid crystal display (TFT LCD) devices or a substrate patterned with micro-electro-mechanical systems (MEMS) devices or imaging sensors. The semiconductor wafer may further include multiple patterned layers formed therein and/or thereon such as doped regions, shallow trench isolation (STI), poly-silicon gates, and metal lines and vias. The wafer and chips include extruded contacts (or contact features) to be bonded. In one example, the contact features include Cu. In another embodiment, the contact features include Sn. The disclosed bonding system integrates the chip cleaning module and the chip-to-wafer bonding module, and further provided a reduced oxygen environment. The oxide contaminations formed on the contact regions of the wafer and/or chips are removed and avoided, resulting improved bonding adhesion and reduced contact resistance.

The present disclosure provides an integrated chip-to-wafer bonding system and oxygen-free bonding environment. Other variations in this spirit and scope are considered as consistent with the present disclosure and are suggestive. For example, various chambers in the disclosed bonding system can be maintained in various vacuum environment, inert gas protection and/or chemical flow to remove oxide and reduce oxygen. Some non critical chambers and modules, such as wafer buffer and loading structures, may be maintained in the atmospheric pressure. In another embodiment, the bonding arm and chip-to-wafer bonding chamber may be maintained at a temperature up to about 500 C. The temperature of the bonding arm and the temperature of the chip-to-wafer bonding chamber are substantially equal in one embodiment.

Thus, the present disclosure provides a bonding apparatus, the apparatus includes a cleaning module designed for cleaning chips; and a chip-to-wafer bonding chamber configured to receive the chips from the cleaning module and designed for bonding the chips to a wafer.

In various embodiments of the disclosed bonding apparatus, the cleaning module may implement at least one of wet cleaning and dry cleaning. The cleaning module may implements a gas to clean the chips, in which the gas is selected from the group consisting of an formic acid vapor, hydrogen, remote plasma of reduction gas, and combinations thereof. The cleaning module may implement HCOOH to clean the chips. The cleaning module may further include a mechanism to remove particles. The cleaning module may include a cleaning chamber configured to clean the chips. The cleaning module may include a chip cleaning channel configured to transport the chips through the chip cleaning channel and clean the chips in the chip cleaning channel. The apparatus may further include a gas supply unit configured to deliver a gas to the chip-to-wafer bonding chamber, providing an oxygen-reduced space in the chip-to-wafer bonding chamber. The chip-to-wafer bonding chamber may include an alignment unit configured to be substantially outside of the oxygen-reduced space. The supplied gas may include an inert gas, forming gas, forming acid vapor flow, or combinations thereof. The chip-to-wafer bonding chamber may be designed operable to be pumped to vacuum state. The bonding apparatus may further include a wafer level bonding chamber designed to implement a wafer level bonding process. The wafer level bonding process may include applying glue to the wafer and the chip. The wafer level bonding process may include applying at least one of a thermal bonding and a mechanical pressure bonding between the wafer and the chip. The wafer level bonding chamber is designed to perform a cleaning process to the wafer. The bonding apparatus may further include a wafer cleaning chamber designed to perform a cleaning process to the wafer. The bonding apparatus may further include a buffer chamber approximate the wafer level bonding chamber and the wafer cleaning chamber, configured to transfer the wafer among the wafer level bonding chamber, the wafer cleaning chamber and the chip-to-wafer bonding chamber. The wafer level bonding chamber may be configured to perform a wafer level bonding process with a temperature ranging between about 100 C and about 500 C.

The present disclosure also provides another embodiment of a bonding apparatus. The bonding apparatus includes a cleaning module designed for cleaning a plurality of chips; a chip-to-wafer bonding chamber designed for bonding the plurality of chips to a wafer; and a wafer level bonding chamber approximate the chip-to-wafer bonding chamber and designed to perform a wafer level bonding of the plurality of chips to the wafer. In one embodiment, the cleaning module includes a cleaning chamber configured to clean the plurality of chips. In another embodiment, the cleaning module includes a chip cleaning channel configured to transport the plurality of chips through the chip cleaning channel and clean the plurality of chips in the chip cleaning channel.

The present disclosure also provides one embodiment of a chip-to-wafer bonding method. The method includes loading a plurality of chips to a chip-to-wafer bonding; and bonding the plurality of chips to a wafer, in which the chip-to-wafer bonding apparatus includes a cleaning module designed for cleaning the plurality of chips; and a chip-to-wafer bonding chamber configured to receive the plurality of chips from the cleaning module and designed to bond the plurality of chips to a wafer; cleaning the plurality of chips. The chip-to-wafer bonding method may further include performing a wafer level bonding to the plurality of chips bonded to the wafer in a wafer level bonding chamber integrated with the chip-to-wafer bonding apparatus.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method comprising:
   transporting a chip through a cleaning module along a conveyor belt, the conveyor belt configured to transport the chip through the cleaning module from a proximal end of the conveyor belt to a distal end of the conveyor belt;
   cleaning the chip within the cleaning module of a chip-to-wafer bonding apparatus, wherein cleaning the chip within the cleaning module includes:
   providing a chemical supply structure that includes a head having a first end and a second end and a plurality of injectors disposed between the first and second end;
   exposing the chip to a protective gas nearest a distal end of the conveyor belt, wherein the protective gas is provided outside and directly adjacent the first end of the chemical supply structure,
   while on the conveyor belt, exposing the chip to a formic acid chemical cleaning that removes oxide from the chip after exposing the chip to the protective gas, the protective material protecting the chip from oxidation occurring on the chip, wherein the exposing the formic acid is provided by the plurality of injectors of the chemical supply structure;

after the formic acid, exposing the chip to another protective gas provided outside and directly adjacent the second end of the chemical supply structure; and bonding the chip to a wafer within a bonding module of the chip-to-wafer bonding apparatus, the bonding module being different than the cleaning module.

2. The method of claim 1, wherein the formic acid chemical is a formic acid vapor.

3. The method of claim 1, further comprising providing the cleaning material and the formic acid chemical to the bonding module of the chip-to-wafer bonding apparatus.

* * * * *